(12) United States Patent
Tian et al.

(10) Patent No.: US 12,707,810 B2
(45) Date of Patent: Aug. 11, 2026

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventors: Xueyan Tian, Beijing (CN); Chunyang Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 598 days.

(21) Appl. No.: 17/771,821

(22) PCT Filed: Jul. 5, 2021

(86) PCT No.: PCT/CN2021/104514
§ 371 (c)(1),
(2) Date: Apr. 26, 2022

(87) PCT Pub. No.: WO2022/028183
PCT Pub. Date: Feb. 10, 2022

(65) Prior Publication Data

US 2022/0376209 A1 Nov. 24, 2022

(30) Foreign Application Priority Data

Aug. 7, 2020 (CN) ........................ 202010786597.2

(51) Int. Cl.
*H10K 59/121* (2023.01)
*H10K 59/80* (2023.01)
*H10K 102/00* (2023.01)

(52) U.S. Cl.
CPC ......... *H10K 59/121* (2023.02); *H10K 59/878* (2023.02); *H10K 59/879* (2023.02); *H10K 2102/00* (2023.02)

(58) Field of Classification Search
None
See application file for complete search history.

(56) References Cited

U.S. PATENT DOCUMENTS 9,991,474 B2 * 6/2018 Kim .................... H10K 59/121
2018/0372933 A1 * 12/2018 Li .................... G02F 1/136227

FOREIGN PATENT DOCUMENTS

CN 204874296 U 12/2015
CN 106405921 A 2/2017
(Continued)

OTHER PUBLICATIONS

International Search Report for PCT/CN2021/104514 Mailed Sep. 24, 2021.

*Primary Examiner* — Jennifer D. Carruth

(57) ABSTRACT

A display substrate and a preparation method therefor, and a display apparatus. The display substrate includes a light-emitting unit layer arranged on a base, and a reflecting layer arranged on the light-emitting unit layer, wherein the light-emitting unit layer comprises a plurality of light-emitting units corresponding to different colors, and the reflecting layer is provided with light transmission holes corresponding to the plurality of light-emitting units on a one-to-one basis; and a light modulation layer is arranged on the side of the reflective layer away from the base, and the light modulation layer is configured to reflect some light rays in a blue light waveband and transmit light rays in wavebands other than the blue light waveband.

14 Claims, 5 Drawing Sheets

(56) References Cited

FOREIGN PATENT DOCUMENTS

| | | | | |
|---|---|---|---|---|
| CN | 110767841 | A | 2/2020 | |
| CN | 111430445 | A | 7/2020 | |
| CN | 111900190 | A | 11/2020 | |
| WO | WO-2011102023 | A1 * | 8/2011 | ........... H01L 27/322 |

* cited by examiner

DISPLAY SUBSTRATE AND PREPARATION METHOD THEREFOR, AND DISPLAY APPARATUS

This application is a national stage application of PCT Application No. PCT/CN2021/104514, which is filed on Jul. 5, 2021, and claims priority to Chinese Patent Application No. 202010786597.2, entitled "Display Substrate and Preparation Method Therefor, and Display Apparatus" and filed with the CNIPA on Aug. 7, 2020, the content of which should be construed as being incorporated herein by reference.

TECHNICAL FIELD

The present disclosure relates, but is not limited, to the field of display technology, and particularly to a display substrate and a preparation method therefor, and a display apparatus.

BACKGROUND

Liquid Crystal Displays (LCDs) and Organic Light Emitting Diodes (OLEDs) are the mainstream display technologies of planar display. LCDs have the characteristics such as small size, low power consumption and no radiation, while OLEDs are active light emitting display devices and have the advantages such as self-luminescence, wide viewing angle, high contrast, relatively low power consumption and extremely high reaction speed.

With the rapid development of display technology, multi-functional display apparatuses are emerging, including mirror display apparatuses that accomplish display and mirror functions. Mirror display means that a user can see the display screen from a display of a mirror while using the mirror, so as to meet people's various needs.

At present, the waveband of light rays emitted by LCDs and OLEDs is approximately between 380 nm and 780 nm, and the short-wave waveband between 380 nm and 500 nm is called a blue light waveband. Blue light is a kind of high-energy visible light, which can directly penetrate the cornea and lens and reach the macular area of the fundus, accelerate the oxidation of macular cells to cause photochemical damages to the retina, and have more serious impact on children's retina.

SUMMARY

The following is a summary of subject matter described in detail herein. The summary is not intended to limit the protection scope of the claims.

A display substrate includes a light-emitting unit layer arranged on a base and a reflective layer arranged on the light-emitting unit layer, the light-emitting unit layer includes a plurality of light emitting units corresponding to different colors, and the reflective layer is provided with light transmission holes corresponding to the plurality of light-emitting units on a one-to-one basis; and a light modulation layer is arranged on a side of the reflective layer away from the base, and the light modulation layer is configured to reflect part of light rays in a blue light waveband and transmit light rays in wavebands other than the blue light waveband.

In some possible implementations, the reflective layer includes a metal-oxide composite structure or a metal-compound composite structure, which forms a colored mirror display.

In some possible implementations, in the metal-oxide composite structure or the metal-compound composite structure, the metal includes any one or more of molybdenum, aluminum and titanium, the oxide includes any one or more of a molybdenum oxide, a copper oxide and a niobium oxide, and the compound includes a metal matrix composite material.

In some possible implementations, the display substrate further includes an optical adhesive layer and a capping layer, the light modulation layer is arranged on the reflective layer, the optical adhesive layer is arranged on the light modulation layer, and the capping layer is arranged on the optical adhesive layer.

In some possible implementations, the display substrate further includes a capping layer arranged on a side of the reflective layer away from the base; and the light modulation layer is arranged on a surface of a side of the capping layer adjacent to the base, or the light modulation layer is arranged on a surface of a side of the capping layer away from the base.

In some possible implementations, the light modulation layer includes a plurality of sub-layers that are stacked, the plurality of sub-layers include a first refractive index layer having a first refractive index and a second refractive index layer having a second refractive index, and the first refractive index layer and the second refractive index layer in the plurality of sub-layers are alternately arranged, the first refractive index being greater than the second refractive index.

In some possible implementations, the light modulation layer includes a first sub-layer, a second sub-layer, and a third sub-layer that are stacked; or the light modulation layer includes a first sub-layer, a second sub-layer, a third sub-layer, a fourth sub-layer and a fifth sub-layer that are stacked; and the first sub-layer, the third sub-layer and the fifth sub-layer are first refractive index layers having a first refractive index, and the second sub-layer and the fourth sub-layer are second refractive index layers having a second refractive index.

In some possible implementations, the thickness of the first sub-layer is 20 nm to 80 nm, the thickness of the second sub-layer is 80 nm to 120 nm, the thickness of the third sub-layer is 20 nm to 80 nm, the thickness of the fourth sub-layer is 80 nm to 120 nm, and the thickness of the fifth sub-layer is 20 nm to 80 nm; or, the thickness of the first sub-layer is 150 nm to 250 nm, the thickness of the second sub-layer is 30 nm to 90 nm, the thickness of the third sub-layer is 150 nm to 250 nm, the thickness of the fourth sub-layer is 30 nm to 90 nm, and the thickness of the fifth sub-layer is 150 nm to 250 nm.

In some possible implementations, in a visible light range, the first refractive index is 1.6 to 2.5, and the second refractive index is 1.3 to 1.5.

A display apparatus includes the display substrate described above.

A preparation method for a display substrate includes: forming a light-emitting unit layer and a reflective layer arranged on the light-emitting unit layer sequentially on a base, the light-emitting unit layer including a plurality of light emitting units corresponding to different colors, and the reflective layer being provided with light transmission holes corresponding to the plurality of light-emitting units on a one-to-one basis; and forming a light modulation layer, the light modulation layer being configured to reflect part of light rays in a blue light waveband and transmit light rays in wavebands other than the blue light waveband.

In some possible implementations, the forming a light modulation layer includes: forming a first sub-layer, a second sub-layer and a third sub-layer sequentially on the reflective layer; or forming a first sub-layer, a second sub-layer, a third sub-layer, a fourth sub-layer and a fifth sub-layer sequentially on the reflective layer; the first sub-layer, the third sub-layer and the fifth sub-layer being first refractive index layers having a first refractive index, and the second sub-layer and the fourth sub-layer being second refractive index layers having a second refractive index, the first refractive index being greater than the second refractive index.

In some possible implementations, the forming a light modulation layer includes: forming a first sub-layer, a second sub-layer and a third sub-layer sequentially on a capping layer; or forming a first sub-layer, a second sub-layer, a third sub-layer, a fourth sub-layer and a fifth sub-layer sequentially on a capping layer; the first sub-layer, the third sub-layer and the fifth sub-layer being first refractive index layers having a first refractive index, the second sub-layer and the fourth sub-layer being second refractive index layers having a second refractive index, the first refractive index being greater than the second refractive index; coating an optical adhesive layer on the reflective layer, and attaching the capping layer formed with a light modulation layer to the optical adhesive layer by an attaching process.

In some possible implementations, the light modulation layer is arranged on a surface of a side of the capping layer adjacent to the base, or the light modulation layer is arranged on a surface of a side of the capping layer away from the base.

In some possible implementations, the material of the reflective layer includes a metal-oxide composite structure or a metal-compound composite structure, which forms a colored mirror display, in the metal-oxide composite structure or the metal-compound composite structure, the metal includes any one or more of molybdenum, aluminum and titanium, the oxide includes any one or more of a molybdenum oxide, a copper oxide and a niobium oxide, and the compound includes a metal matrix composite material; the thickness of the first sub-layer is 20 nm to 80 nm, the thickness of the second sub-layer is 80 nm to 120 nm, the thickness of the third sub-layer is 20 nm to 80 nm, the thickness of the fourth sub-layer is 80 nm to 120 nm, and the thickness of the fifth sub-layer is 20 nm to 80 nm; or, the thickness of the first sub-layer is 150 nm to 250 nm, the thickness of the second sub-layer is 30 nm to 90 nm, the thickness of the third sub-layer is 150 nm to 250 nm, the thickness of the fourth sub-layer is 30 nm to 90 nm, and the thickness of the fifth sub-layer is 150 nm to 250 nm.

Other aspects may be understood upon reading and understanding of the accompanying drawings and detailed descriptions.

BRIEF DESCRIPTION OF DRAWINGS

Accompanying drawings are used to provide further understanding of technical solutions of the present disclosure, constitute a part of the specification, and are used to explain the technical solutions of the present disclosure together with embodiments of the present disclosure, thus do not constitute a limitation on the technical solutions of the present disclosure. The shape and size of each component in the drawings do not reflect the true scale, but are only intended to schematically describe the contents of the present disclosure.

DESCRIPTION OF REFERENCE SIGNS

Figure 1:
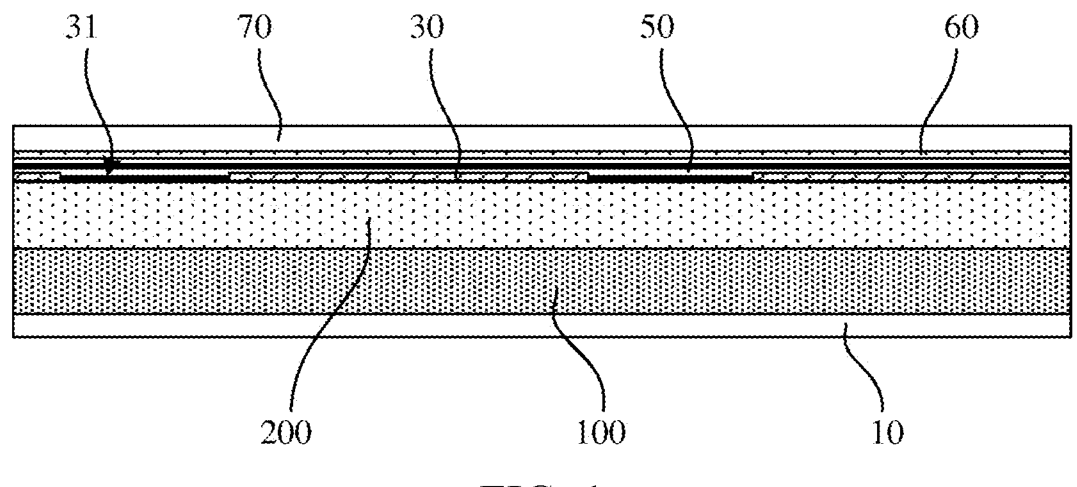
FIG. 1 is a schematic diagram of a structure of a display substrate according to an exemplary embodiment of the present disclosure.

10—base; 11—first insulating layer; 12—second insulating layer; 13—third insulating layer; 14—fourth insulating layer; 15—planarization layer; 21—anode; 22—pixel definition layer; 23—organic light emitting layer; 24—cathode; 25—encapsulation structure layer; 30—reflective layer; 31—light transmission hole; 50—light modulation layer; 60—optical adhesive layer; 70—capping layer; 100—driving structure layer; 101—transistor; 102—storage capacitor; and 200—light emitting structure layer.

DETAILED DESCRIPTION

Implementation modes herein may be carried out in multiple different forms. Those of ordinary skills in the art may readily appreciate a fact that the implementation modes and contents may be varied into various forms without departing from the spirit and scope of the present disclosure. Therefore, the present disclosure should not be construed as being only limited to the contents recorded in the following implementation modes. The embodiments in the present disclosure and features in the embodiments may be combined randomly with each other if there is no conflict.

In the accompanying drawings, a size of a constituent element, and a thickness or an area of a layer may be exaggerated sometimes for clarity. Therefore, any one implementation mode of the present disclosure is not necessarily limited to dimensions shown in the drawings, and the shapes and sizes of the components in the accompanying drawings do not reflect true scales. In addition, the accompanying drawings schematically show an ideal example, and any one implementation mode of the present disclosure is not limited to the shapes, values, or the like shown in the accompanying drawings.

Ordinal numerals such as “first”, “second”, and “third” herein are set to avoid confusion between constituent elements, but are not intended to limit in terms of quantity.

In the specification, for convenience, words and sentences indicating orientations or positional relationships, such as “center”, “upper”, “lower”, “front”, “back”, “vertical”, “horizontal”, “top”, “bottom”, “inside” and “outside”, are used for describing positional relationships of constituent elements with reference to the accompanying drawings, and are merely for facilitating describing the implementation modes and simplifying the description, rather than indicating or implying that referred apparatuses or elements must have particular orientations, and be constructed and operated in particular orientations. Thus, they cannot be construed as a limitation to the present disclosure. The positional relationships of the constituent elements may appropriately change according to directions of the constituent elements described. Therefore, the words and sentences are not limited to those described in the specification, but may be replaced appropriately according to a situation.

In the specification, unless otherwise specified and defined explicitly, the terms “mount”, “mutually connect” and “connect” should be understood in a broad sense, which, for example, may be a fixed connection, or a detachable connection, or an integral connection; may be a mechanical connection or an electrical connection; may be a direct connection, or an indirect connection through an intermediary, or an internal communication between two elements. Those of ordinary skills in the art may understand meanings of the above terms in the present disclosure according to situations.

In the specification, a transistor refers to an element at least including three terminals, i.e., a gate electrode, a drain electrode, and a source electrode. A transistor has a channel region between a drain electrode (or referred to as a drain electrode terminal, a drain region, or a drain electrode) and a source electrode (or referred to as a source electrode terminal, a source region, or a source electrode), and a current can flow through the drain electrode, the channel region and the source electrode. Herein, the channel region refers to a region through which the current mainly flows.

In the specification, a first pole may be a drain electrode and a second pole may be a source electrode; or the first pole may be a source electrode and the second pole may be a drain electrode. In cases that transistors with opposite polarities are used, or a direction of a current changes during working of a circuit, or the like, functions of the “source electrode” and the “drain electrode” may sometimes be exchanged. Therefore, the “source electrode” and the “drain electrode” may be exchanged in the specification.

In the specification, an “electric connection” includes a case where constituent elements are connected together through an element having a certain electric function. There is no specific restriction on the “element having a certain electric function” as long as it allows transmitting and receiving of electrical signals between connected constituent elements. The “element having a certain electric function” may be, for example, an electrode or wiring, or a switching element such as a transistor, or other functional elements such as a resistor, an inductor or a capacitor, etc.

In the specification, “parallel” refers to a state in which an angle formed by two straight lines is −10° or more and 10° or less, and thus also includes a state in which the angle is −5° or more and 5° or less. In addition, “perpendicular” refers to a state in which an angle formed by two straight lines is 80° or more and 100° or less, and thus also includes a state in which the angle is 85° or more and 95° or less.

In the specification, “film” and “layer” may be exchanged. For example, a “conductive layer” may be replaced with a “conductive film” sometimes. Similarly, an “insulating film” may be replaced with an “insulating layer” sometimes.

In the specification, “about” refers to that a boundary is defined not so strictly and numerical values within process and measurement error ranges are allowed.

Relevant standards and the eye injury energy curve of blue light show that the waveband harmful to eyes is 430 nm to 480 nm. For an LCD display apparatus, the light rays emitted from a backlight source contain light rays in this waveband, and the intensity thereof is relatively high. For an OLED display apparatus, the emitted blue light is concentrated at about 460 nm, which will also cause damages to eyes. Studies have shown that the blue light emitted from an LCD and an OLED is harmful to the retina in a cumulative manner over time. For example, prolonged use of cell phones or computers may exceed the tolerance level of the cells in the light-sensing area of the retina, which will further affect the eyes and lead to vision loss. Since the eyes of teenagers are in a developing state, they are more vulnerable to the blue light.

The present disclosure provides a display substrate, including a light-emitting unit layer arranged on a base and a reflective layer arranged on the light-emitting unit layer, the light-emitting unit layer including a plurality of light emitting units corresponding to different colors, and the reflective layer being provided with light transmission holes corresponding to the plurality of light-emitting units on a one-to-one basis; and a light modulation layer being arranged on a side of the reflective layer away from the base, the light modulation layer being configured to reflect part of light rays in a blue light waveband and transmit light rays in wavebands other than the blue light waveband.

In an exemplary implementation, the reflective layer includes a metal-oxide composite structure or a metal-compound composite structure, which forms a colored mirror display.

In an exemplary implementation, in the metal-oxide composite structure or the metal-compound composite structure, the metal includes any one or more of molybdenum, aluminum and titanium, the oxide includes any one or more of a molybdenum oxide, a copper oxide and a niobium oxide, and the compound includes a metal matrix composite material.

In an exemplary implementation, the display substrate further includes an optical adhesive layer and a capping layer, the light modulation layer is arranged on a surface of a side of the reflective layer away from the base, the optical adhesive layer is arranged on a surface of a side of the light modulation layer away from the base, and the capping layer is arranged on a surface of a side of the optical adhesive layer away from the base.

In an exemplary implementation, the display substrate further includes an optical adhesive layer and a capping layer, the capping layer is arranged on a side of the reflective layer away from the base, the light modulation layer is arranged on a surface of a side of the capping layer adjacent to the base, and the optical adhesive layer is arranged between the reflective layer and the light modulation layer.

In an exemplary implementation, the display substrate further includes an optical adhesive layer and a capping layer, the capping layer is arranged on a side of the reflective layer away from the base, the light modulation layer is arranged on a surface of a side of the capping layer away from the base, and the optical adhesive layer is arranged between the reflective layer and the capping layer.

In an exemplary implementation, the light modulation layer includes a plurality of sub-layers that are stacked, the plurality of sub-layers include a first refractive index layer having a first refractive index and a second refractive index layer having a second refractive index, and the first refractive index layer and the second refractive index layer in the plurality of sub-layers are alternately arranged.

In an exemplary implementation, a first layer and a last layer are both first refractive index layers.

In an exemplary implementation, the first refractive index is greater than the second refractive index.

In an exemplary implementation, in a visible light range, the first refractive index may be about 1.6 to 2.5, and the second refractive index may be about 1.3 to 1.5.

In an exemplary implementation, the light modulation layer includes a first sub-layer, a second sub-layer and a third sub-layer that are stacked, the first sub-layer and the third sub-layer are first refractive index layers having a first refractive index, and the second sub-layer is a second refractive index layer having a second refractive index.

In a possible exemplary implementation, the thickness of the first sub-layer may be about 20 nm to 80 nm, the thickness of the second sub-layer may be about 80 nm to 120 nm, and the thickness of the third sub-layer may be about 20 nm to 80 nm.

In a possible exemplary implementation, the thickness of the first sub-layer may be about 150 nm to 250 nm, the thickness of the second sub-layer may be about 30 nm to 90 nm, and the thickness of the third sub-layer may be about 150 nm to 250 nm.

In an exemplary implementation, the light modulation layer includes a first sub-layer, a second sub-layer, a third sub-layer, a fourth sub-layer and a fifth sub-layer that are stacked, the first sub-layer, the third sub-layer and the fifth sub-layer are first refractive index layers having a first refractive index, and the second sub-layer and the fourth sub-layer are second refractive index layers having a second refractive index.

In a possible exemplary implementation, the thickness of the first sub-layer is about 20 nm to 80 nm, the thickness of the second sub-layer is about 80 nm to 120 nm, the thickness of the third sub-layer is about 20 nm to 80 nm, the thickness of the fourth sub-layer is about 80 nm to 120 nm, and the thickness of the fifth sub-layer is about 20 nm to 80 nm.

In a possible exemplary implementation, the thickness of the first sub-layer is about 150 nm to 250 nm, the thickness of the second sub-layer is about 30 nm to 90 nm, the thickness of the third sub-layer is about 150 nm to 250 nm, the thickness of the fourth sub-layer is about 30 nm to 90 nm, and the thickness of the fifth sub-layer is about 150 nm to 250 nm.

In an exemplary implementation, the material of the first refractive index layer may include any one or more of: an oxide and a nitride, the oxide may include any one or more of: titanium dioxide, zirconium dioxide and niobium pentoxide, and the nitride may include silicon nitride.

In an exemplary implementation, the material of the second refractive index layer may include any one or more of: silicon dioxide, magnesium fluoride, hafnium oxide, and aluminum oxide.

In an exemplary implementation, the plurality of sub-layers in the light modulation layer may be sequentially deposited by plasma enhanced chemical vapor deposition (PECVD).

In an exemplary implementation, the light modulation layer of the present disclosure is a periodic multilayer film system, and the basic structure thereof is a periodic multilayer film system $(LH)^S$ with a λ8 film layer added to both sides of the multilayer film system $(LH)^S$ to form a $(0.5HL0.5H)^S$ periodic multilayer film system, i.e.

$$\left(\frac{H}{2}L\frac{H}{2}\right)^s$$

H is a first refractive index layer having a first refractive index (a high refractive index), L is a second refractive index layer having a second refractive index (a low refractive index), the first refractive index is greater than the second refractive index, and S=1, 2, 3, . . . , N, which is the number of periods of the multilayer film system. For example, a periodic multilayer film system (0.5HL0.5H) represents three layers including a first refractive index layer, a second refractive index layer and a first refractive index layer that are stacked. As another example, the periodic multilayer film system $(0.5HL0.5H)^2$ represents five layers including a first refractive index layer, a second refractive index layer, a first refractive index layer, a second refractive index layer and a first refractive index layer that are stacked.

The $(0.5HL0.5H)^S$ periodic multilayer film system uses the principle of multi-beam interference to make beams in a certain wavelength range (waveband) highly reflective, while making beams deviating from the wavelength range (waveband) highly transmissive, and its basic feature is a series of highly reflective layers spaced by a series of highly transmissive layers. In an exemplary embodiment of the present disclosure, the light modulation layer may be referred to as a blue light cut-off filter layer, which has a high reflectivity for light rays in the blue light waveband and a high transmittance for light rays in the green and red light wavebands.

In the exemplary implementation, considering the thickness, preparation time and process achievability of the light modulation layer, S is set to be equal to 1 to 10.

FIG. 1 is a schematic diagram of a structure of a display substrate according to an exemplary embodiment of the present disclosure, illustrating a mirror OLED structure. As shown in FIG. 1, in an exemplary implementation, the display substrate includes a base 10, a driving structure layer 100 arranged on the base 10, a light emitting structure layer 200 arranged on a surface of a side of the driving structure layer 100 away from the base 10, a reflective layer 30 arranged on a surface of a side of the light emitting structure layer 200 away from the base 10, a light modulation layer 50 arranged on a surface of a side of the reflective layer 30 away from the base 10, an optical adhesive layer 60 arranged on a surface of a side of the light modulation layer 50 away from the base 10, and a capping layer 70 arranged on a surface of a side of the optical adhesive layer 60 away from the base 10. The driving structure layer 100 and the light emitting structure layer 200 constitute a light-emitting unit layer in an exemplary embodiment of the present disclosure.

In a plane parallel to the base, the light-emitting unit layer includes a plurality of light emitting units corresponding to different colors that are arranged periodically. In an exemplary implementation, the plurality of light emitting units may include a red light emitting unit that emits red light rays, a green light emitting unit that emits green light rays, and a blue light emitting unit that emits blue light rays. In some possible implementations, the plurality of light emitting units may include a red light emitting unit, a green light emitting unit, a blue light emitting unit, and a white light emitting unit that emits white light rays.

In an exemplary implementation, the driving structure layer 100 may include a plurality of thin film transistors and a storage capacitor, which form a pixel driving circuit. In an exemplary implementation, the driving structure layer may include a first insulating layer, a semiconductor layer, a second insulating layer, a first gate metal layer, a third insulating layer, a second gate metal layer, a fourth insulating layer, a source-drain metal layer and a planarization layer that are sequentially arranged on the base 10.

In an exemplary implementation, the light emitting structure layer may include an anode, a pixel definition layer, an organic light emitting layer, a cathode and an encapsulation structure layer.

In an exemplary implementation, the reflective layer 30 of each light emitting unit may be provided with a light transmission hole 31, and the positions of the plurality of light transmission holes 31 are in a one-to-one correspondence to the positions of the organic light emitting layers in the plurality of light emitting units.

In an exemplary implementation, the light modulation layer 50 may include a plurality of sub-layers that are stacked, and the light modulation layer 50 is configured to reflect part of light rays in a blue light waveband and transmit light rays in wavebands other than the blue light waveband.

Exemplary description is made below through a preparation process of a display substrate. "Patterning process" mentioned in the present disclosure includes photoresist coating, mask exposure, development, etching, photoresist stripping, etc., for metal materials, inorganic materials or transparent conductive materials, and includes organic material coating, mask exposure, development, etc., for organic materials. Any one or more of sputtering, evaporation and chemical vapor deposition may be used for deposition, any one or more of spray coating, spin coating and inkjet printing may be used for coating, and any one or more of dry etching and wet etching may be used for etching, which are not limited in the present disclosure. A "thin film" refers to a layer of thin film manufactured with a certain material on a base using deposition or other processes. If the "thin film" does not need the patterning process in the entire manufacturing process, the "thin film" may also be called a "layer". If the "thin film" needs the patterning process in the entire manufacturing process, the "thin film" is called a "thin film" before the patterning process is performed and is called a "layer" after the patterning process is performed. The "layer" which has experienced the patterning process includes at least one "pattern". "A and B being disposed in the same layer" in the present disclosure means that A and B are formed simultaneously through a single patterning process. The "thickness" of the film layer is the dimension of the film layer in a direction perpendicular to the display substrate. In an exemplary embodiment of the present disclosure, "an orthographic projection of A including an orthographic projection of B" means that a boundary of the orthographic projection of B falls within a range of a boundary of the orthographic projection of A, or the boundary of the orthographic projection of A overlaps with the boundary of the orthographic projection of B.

In an exemplary implementation, the preparation process of a display substrate includes the following operations.

(1) A base 10 is formed on a glass carrier plate 1. In an exemplary implementation, forming the base 10 on the glass carrier plate 1 may include: coating a first flexible material thin film on the glass carrier plate 1 to form a first flexible layer after it is cured into a film; coating a second flexible material thin film on a surface of a side of the first flexible layer away from the glass carrier plate 1 to form a second flexible layer after it is cured into a film; and coating a third flexible material thin film on a surface of a side of the second flexible layer away from the glass carrier plate 1 to form a third flexible layer after it is cured into a film, thereby forming the flexible base 10 on the glass carrier plate 1. The base 10 includes the first flexible layer, the second flexible layer and the third flexible layer which are stacked.

In another exemplary implementation, forming the base 10 on the glass carrier plate 1 may include: first coating a first flexible material thin film on the glass carrier plate 1 to form a first flexible layer after it is cured into a film; then depositing a first inorganic material thin film on the first flexible layer to form a first inorganic layer overlying the first flexible layer; then depositing an amorphous silicon thin film on the first inorganic layer to form an amorphous silicon layer overlying the first inorganic layer; then coating a second flexible material thin film on the amorphous silicon layer to form a second flexible layer after it is cured into a film; and finally depositing a second inorganic material thin film on the second flexible layer to form a second barrier layer overlying the second flexible layer, thereby forming the flexible base 10 on the glass carrier plate 1. The base 10 includes the first flexible layer, the first inorganic layer, a semiconductor layer, the second flexible layer and the second inorganic layer which are stacked.

In an exemplary implementation, the materials of the first, second and third flexible material thin films may be polyimide (PI), polyethylene terephthalate (PET), Pressure Sensitive Adhesive (PSA), a surface-treated polymer flexible film, etc., and the materials of the first and second inorganic material thin films may be silicon nitride (SiNx), silicon oxide (SiOx), etc., which are used to improve the water and oxygen resistance of the base. The first and second inorganic layers are called first and second barrier layers, and the material of the semiconductor layer may be amorphous silicon (a-si).

In an exemplary implementation, the first flexible layer, the second flexible layer and the third flexible layer may be made of the same material or may be made of different materials. In some possible implementations, the material of the first flexible layer includes pressure sensitive adhesive, and the materials of the second flexible layer and the third flexible layer both include polyimide.

Figure 2:
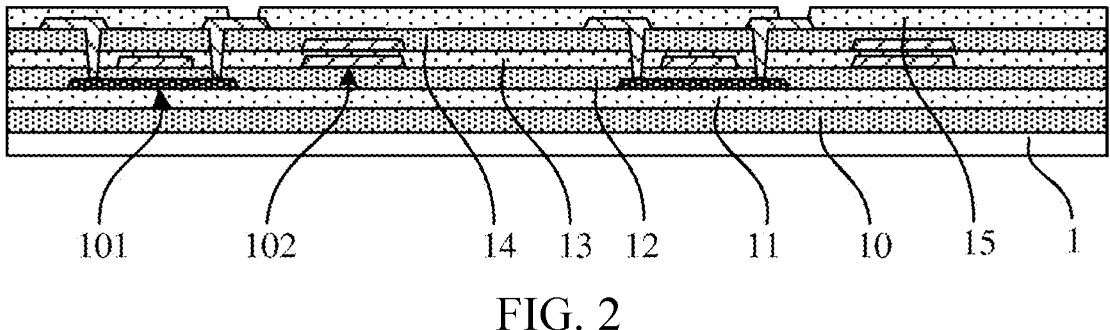
FIG. 2 is a schematic diagram after a pattern of a driving structure layer is formed according to an exemplary embodiment of the present disclosure.

(2) A pattern of a driving structure layer is formed on the base 10, as shown in FIG. 2. In an exemplary implementation, the driving structure layer may include a plurality of transistors and a storage capacitor, which constitute a pixel driving circuit. FIG. 2 illustrates driving structure layers of two sub-pixels, and the driving structure layer of each sub-pixel is illustrated by taking one transistor and one storage capacitor as an example. In an exemplary implementation, the preparation process of the driving structure layer may include the following operations.

A first insulating thin film and a semiconductor layer thin film are deposited sequentially on the base 10, and the semiconductor layer thin film is patterned through a patterning process to form a first insulating layer 11 overlying the entire base 10 and a pattern of a semiconductor layer arranged on the first insulating layer 11. The pattern of the semiconductor layer at least includes an active layer arranged in each sub-pixel. In an exemplary implementation, the present patterning process is called a first patterning process.

Then, a second insulating thin film and a first metal thin film are deposited sequentially, and the first metal thin film is patterned through a patterning process to form a second insulating layer 12 overlying the pattern of the semiconductor layer and a pattern of a first gate metal layer arranged on the second insulating layer 12. The pattern of the first gate metal layer at least includes a gate electrode and a first capacitor electrode arranged in each sub-pixel. In an exemplary implementation, the present patterning process is called a second patterning process.

Then, a third insulating thin film and a second metal thin film are deposited sequentially, and the second metal thin film is patterned through a patterning process to form a third insulating layer 13 overlying the first gate metal layer and a pattern of a second gate metal layer arranged on the third insulating layer 13. The pattern of the second gate metal layer at least includes a second capacitor electrode arranged in each sub-pixel, and a position of the second capacitor electrode corresponds to that of the first capacitor electrode. In an exemplary implementation, the present patterning process is called a third patterning process.

Then, a fourth insulating thin film is deposited, and the fourth insulating thin film is patterned through a patterning process to form a pattern of a fourth insulating layer 14 overlying the second gate metal layer. The fourth insulating layer 14 is provided with patterns of a plurality of via holes. The patterns of the plurality of via holes at least include two first via holes arranged in each sub-pixel, and positions of the two first via holes correspond respectively to positions of two ends of an active layer. The fourth insulating layer 14, the third insulating layer 13 and the second insulating layer 12 in the two first via holes are etched away to expose the surface of the active layer. In an exemplary implementation, the present patterning process is called a fourth patterning process.

Then, a third metal thin film is deposited, and the third metal thin film is patterned through a patterning process to form a pattern of a source-drain metal layer on the fourth insulating layer 14. The pattern of the source-drain metal layer at least includes a source electrode and a drain electrode arranged in each sub-pixel, and the source electrode and the drain electrode are respectively connected with the active layer through the first via hole, so that a conductive channel is formed between the source electrode and the drain electrode. In an exemplary implementation, the present patterning process is called a fifth patterning process.

Finally, a planarization thin film is coated to form a planarization (PLN) layer 15 overlying the entire base 10. Patterns of via holes are formed through a patterning process on the planarization layer 15. The patterns of the via holes at least include a second via hole provided in each sub-pixel, the planarization layer 15 in the second via hole is developed away to expose a surface of the drain electrode, and a surface of a side of the planarization layer 15 away from the base 10 is a flat and straight surface. In an exemplary implementation, the present patterning process is called a sixth patterning process.

So far, the pattern of the driving structure layer has been prepared on the base 10, as shown in FIG. 2. The active layer, the gate electrode, the source electrode and the drain electrode form a transistor 101, and the first capacitor electrode and the second capacitor electrode form a storage capacitor 102. In an exemplary implementation, the transistor 101 may be a drive transistor in the pixel driving circuit. The drive transistor may be a Thin Film Transistor (TFT).

In an exemplary implementation, the first insulating layer, the second insulating layer, the third insulating layer and the fourth insulating layer may be made of any one or more of silicon oxide (SiOx), silicon nitride (SiNx) and silicon oxynitride (SiON), and may be a single layer, multiple layers or a composite layer. The first insulating layer is referred to as a buffer layer, which is used to improve water and oxygen resistance of the base. The second insulating layer and the third insulating layer are referred to as gate insulating (GI) layers. The fourth insulating layer is referred to as an interlayer insulating (ILD) layer. The planarization thin film may be made of a resin material, etc. The first metal thin film, the second metal thin film and the third metal thin film may be made of metal materials, such as any one or more of silver (Ag), copper (Cu), aluminum (Al), titanium (Ti) and molybdenum (Mo), or alloy materials of the aforementioned metals, such as aluminum neodymium alloy (AlNd) or molybdenum niobium alloy (MoNb), and may be a single-layered structure or a multi-layered composite structure, such as Ti/Al/Ti, etc. The active layer thin film may be made of various materials, such as amorphous indium gallium zinc oxide (a-IGZO), zinc oxynitride (ZnON), indium zinc tin oxide (IZTO), amorphous silicon (a-Si), polycrystalline silicon (p-Si), sexithiophene, or polythiophene, that is, the present disclosure is applicable to transistors manufactured based on oxide technology, silicon technology or organic matter technology.

Figure 3:
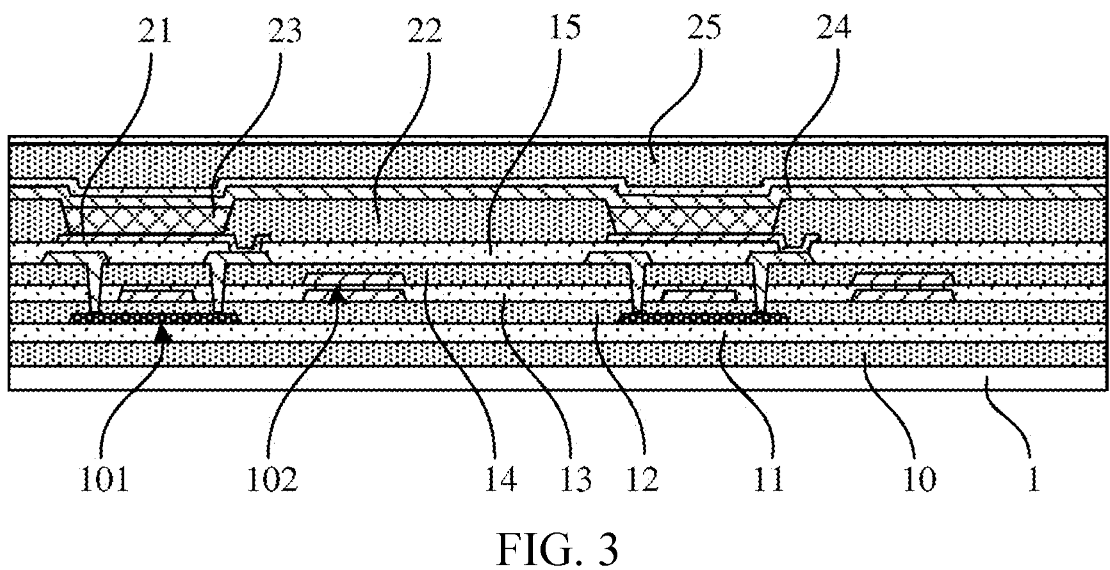
FIG. 3 is a schematic diagram after a pattern of a light emitting structure layer is formed according to an exemplary embodiment of the present disclosure.

(3) A light emitting structure layer is formed on the driving structure layer, as shown in FIG. 3. In an exemplary implementation, forming the light emitting structure layer on the driving structure layer may include the following operations.

A transparent conductive thin film is deposited on the base on which the above patterns are formed, and the transparent conductive thin film is patterned through a patterning process to form a pattern of a transparent conductive layer. The pattern of the transparent conductive layer at least includes an anode 21 arranged in each sub-pixel, and the anode 21 is connected with the drain electrode of the first transistor 101 through the second via hole. In an exemplary implementation, the present patterning process is called a seventh patterning process. In an exemplary implementation, the transparent conductive thin film may be made of indium tin oxide (ITO) or indium zinc oxide (IZO), and may be a single layer structure, or a composite layer structure, such as ITO/Al/ITO, etc.

A pixel definition thin film is coated on the base on which the above patterns are formed, and the pixel definition thin film is mask exposed and developed through a patterning process to form a pixel definition layer (PDL) 22. In each sub-pixel, the pixel definition layer 22 is provided with a pixel opening, and the pixel definition thin film in the pixel opening is developed away to expose a surface of the anode 21. In an exemplary implementation, the present patterning process is called an eighth patterning process. In an exemplary implementation, the pixel definition thin film may be made of a material such as polyimide, acrylic, or polyethylene terephthalate.

An organic material thin film is coated on the base on which the above patterns are formed, and the organic material thin film is mask exposed and developed through a patterning process to form patterns of a plurality of photo spacers (PS). In an exemplary implementation, the present patterning process is called a ninth patterning process.

An organic light emitting layer 23 and a cathode 24 are sequentially formed on the base on which the above patterns are formed. In each sub-pixel, the organic light emitting layer 23 is formed in the pixel opening to realize connection between the organic light emitting layer 23 and the anode 21, the cathode 24 is formed on the organic light emitting layer 23 and the pixel definition layer 22 to realize connection between the cathode 24 and the organic light emitting layer 23, and the cathodes 24 of a plurality of sub-pixels are an integrated structure. In an exemplary implementation, the organic light emitting layer 23 includes a hole injection layer, a hole transport layer, a light emitting layer, an electron transport layer and an electron injection layer which are stacked.

An encapsulation structure layer 25 is formed on the base on which the above patterns are formed. In an exemplary implementation, the encapsulation structure layer 25 may adopt a layer-stacked structure of an inorganic material/an organic material/an inorganic material, in which an organic material layer is arranged between two inorganic material layers. In an exemplary implementation, the process of forming the encapsulation structure layer 25 may include: depositing a first inorganic thin film in a display area by plasma enhanced chemical vapor deposition (PECVD) using an Open Mask to form a first encapsulation layer. Since the open mask shields a bonding area, the first encapsulation layer exposes bonding pads of the bonding area. The plasma enhanced chemical vapor deposition is a low-temperature process, and its operating temperature is about 80°. An organic material is inkjet printed on the first encapsulation layer in the display area through an inkjet printing process, and after it is cured into a film, a second encapsulation layer is formed. Since the inkjet printing process is adopted, the second encapsulation layer may be formed only in the display area. A second inorganic thin film is deposited in the display area by using an open mask to form a third encapsulation layer. In an exemplary embodiment, the first encapsulation layer and the third encapsulation layer may be made of any one or more of silicon oxide (SiOx), silicon nitride (SiNx), and silicon oxynitride (SiON), and may be a single layer, multiple layers, or a composite layer. The second encapsulation layer may be made of a resin material. In an exemplary embodiment, the thickness of the first encapsulation layer may be about 0.8 μm to 1.2 μm, the thickness of the second encapsulation layer may be about 10 μm to 15 μm, and the thickness of the third encapsulation layer may be about 0.5 μm to 0.7 μm. In some possible implementations, the thickness of the first encapsulation layer may be about 1 μm, the thickness of the second encapsulation layer may be about 12 μm, and the thickness of the third encapsulation layer may be about 0.6 μm.

So far, the pattern of the light emitting structure layer has been prepared on the driving structure layer, as shown in FIG. 3.

Figures 4, 5, 6:
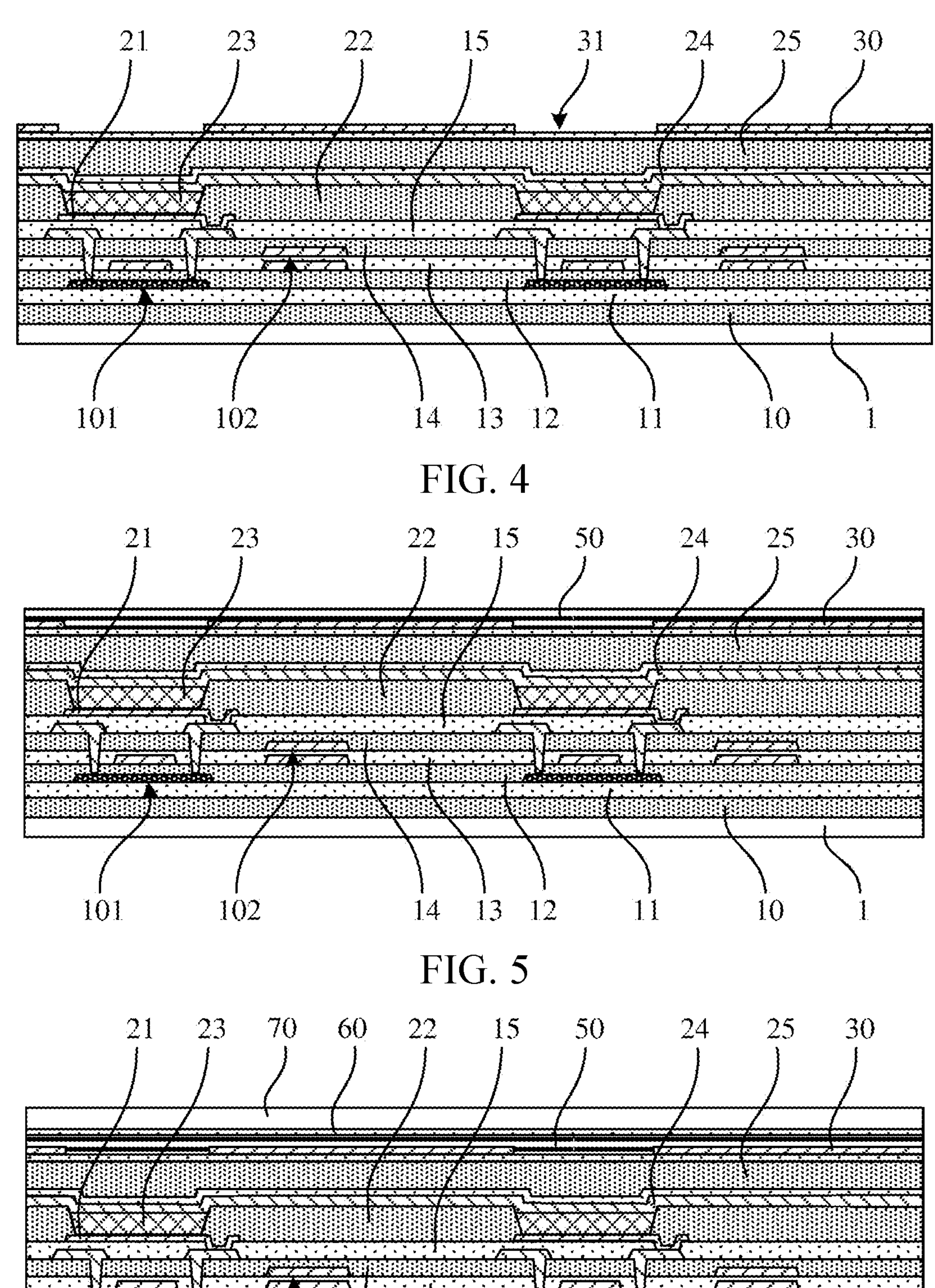
FIG. 4 is a schematic diagram after a pattern of a reflective layer is formed according to an exemplary embodiment of the present disclosure.
FIG. 5 is a schematic diagram after a pattern of a light modulation layer is formed according to an exemplary embodiment of the present disclosure.
FIG. 6 is a schematic diagram after a capping layer is formed according to an exemplary embodiment of the present disclosure.

(4) A reflective layer is formed on the light emitting structure layer. In an exemplary implementation, forming the reflective layer on the light emitting structure layer may include: depositing a reflective thin film on the base on which the above patterns are formed, and patterning the reflective thin film by a patterning process to form a pattern of a reflective layer. The pattern of the reflective layer at least includes a reflective layer 30 arranged on the encapsulation structure layer 25 and a light transmission hole 31 provided in each sub-pixel, and the position of the light transmission hole 31 corresponds to the position of the pixel opening of the light emitting structure layer, as shown in FIG. 4. In an exemplary implementation, the present patterning process is called a tenth patterning process.

In an exemplary implementation, the area of the light transmission holes 31 in the reflective layer 30 may be about 10% to 40% of the area of the sub-pixels. That is, on a plane parallel to the display substrate, the area of an orthographic projection of the reflective layer 30 on the base is about 60% to 90% of the area of the sub-pixels. In an exemplary implementation, an orthographic projection of the light transmission hole 31 on the base may be larger than, equal to, or smaller than an orthographic projection of the pixel opening on the base. When the orthographic projection of the light transmission hole 31 on the base is larger than the orthographic projection of the pixel opening on the base, the area of the light transmission hole 31 is larger than the area of a light emitting area, and the display brightness is improved, but the mirror effect is weakened. When the orthographic projection of the light transmission hole 31 on the base is smaller than the orthographic projection of the pixel opening on the base, the area of the light transmission hole 31 is smaller than the area of the light emitting area, and the mirror effect is enhanced, but the display brightness is weakened. In an exemplary implementation, the area of the light emitting area is the area of the pixel opening.

In an exemplary implementation, in a plane parallel to the base, the shape of the light transmission hole 31 may be a square shape, a rectangular shape, a circular shape, an elliptical shape, a hexagonal shape, or the like, which may be set according to actual needs and is not limited in the present disclosure.

In an exemplary implementation, a white mirror effect or a colored mirror effect may be formed by setting the material of the reflective layer 30.

In an exemplary implementation, the material of the reflective layer 30 forming the white mirror effect may include a metal material including any one or more of: molybdenum (MO), aluminum (Al), titanium (Ti), Ti/Al/Ti, and ITO/Ag/ITO.

In an exemplary implementation, the material of the reflective layer 30 forming the colored mirror effect may include a metal-oxide composite structure or a metal-compound composite structure.

In an exemplary implementation, the metal in the composite structure may include any one or more of: molybdenum (MO), aluminum (Al) and titanium (Ti); and the oxide in the composite structure may include any one or more of: Mo oxide, copper (Cu) oxide, and niobium (Nb) oxide, or include a mixed oxide in which iron oxide, indium oxide and the like are added to $MoO_2$, or include a mixed oxide in which ZnO and the like are added to Nb oxide; and the compound in the composite structure may include Metal Matrix Composites (MMC).

In an exemplary implementation, the composite structure includes a layer-stacked structure which may include two or more layers, for example, Al/MMC, AL/ITO/MMC, AL/SiNx/MMC, etc.

In an exemplary implementation, the metal-oxide layer-stacked structure or the metal-compound layer-stacked structure may be prepared by processes such as low temperature sputtering or low temperature magnetron sputtering. The prepared metal-oxide layer-stacked structure or metal-compound layer-stacked structure is a dark-colored thin film, which has a reflectivity close to that of a circular polarizer, and has the characteristic of low reflectivity.

In an exemplary implementation, the thickness of the reflective layer 30 may be about 0.10 μm to 0.70 μm. In some possible implementations, the thickness of the reflective layer may be about 0.30 μm to 0.40 μm.

In an exemplary implementation, an orthographic projection of the reflective layer 30 on the base includes an orthographic projection of the encapsulation structure layer 25 on the base, so that the whole encapsulation structure layer 25 is covered by the reflective layer 30, improving the mirror effect.

(5) A light modulation layer is formed on the reflective layer. In an exemplary implementation, forming the light modulation layer on the reflective layer may include: alternately forming a plurality of first refractive index layers and second refractive index layers on the base on which the above patterns are formed to form a light modulation layer 50 on the reflective layer, as shown in FIG. 5.

In an exemplary implementation, the light modulation layer may be referred to as a blue light cut-off filter layer. The light modulation layer 50 includes a plurality of sub-layers formed sequentially. The plurality of sub-layers include a first refractive index layer having a first refractive index and a second refractive index layer having a second refractive index. The first refractive index layers and the second refractive index layers in the plurality of sub-layers are alternately arranged, the first refractive index being greater than the second refractive index.

In an exemplary implementation, a first layer and a last layer in the plurality of sub-layers are both first refractive index layers.

In an exemplary implementation, the light modulation layer 50 may include three sub-layers, five sub-layers, seven sub-layers, nine sub-layers or eleven sub-layers, etc., the number of sub-layers being an odd number.

In an exemplary implementation, the light modulation layer 50 may include a first sub-layer, a second sub-layer and a third sub-layer formed sequentially on the reflective layer, the first sub-layer and the third sub-layer are first refractive index layers having a first refractive index, and the second sub-layer is a second refractive index layer having a second refractive index.

In an exemplary implementation, the thickness of the first refractive index layer may be smaller than the thickness of the second refractive index layer. In some possible implementations, the thickness of the first sub-layer may be about 20 nm to 80 nm, the thickness of the second sub-layer may be about 80 nm to 120 nm, and the thickness of the third sub-layer may be about 20 nm to 80 nm.

In an exemplary implementation, the thickness of the first refractive index layer may be greater than the thickness of the second refractive index layer. In some possible implementations, the thickness of the first sub-layer may be about 150 nm to 250 nm, the thickness of the second sub-layer may be about 30 nm to 90 nm, and the thickness of the third sub-layer may be about 150 nm to 250 nm.

In an exemplary implementation, the light modulation layer 50 may include a first sub-layer, a second sub-layer, a third sub-layer, a fourth sub-layer and a fifth sub-layer formed sequentially on the reflective layer. The first sub-layer, the third sub-layer and the fifth sub-layer are first refractive index layers having a first refractive index, and the second sub-layer and the fourth sub-layer are second refractive index layers having a second refractive index.

In an exemplary implementation, the thickness of the first refractive index layer may be smaller than the thickness of the second refractive index layer. In some possible implementations, the thickness of the first sub-layer may be about 20 nm to 80 nm, the thickness of the second sub-layer may be about 80 nm to 120 nm, the thickness of the third sub-layer may be about 20 nm to 80 nm, the thickness of the fourth sub-layer may be about 80 nm to 120 nm, and the thickness of the fifth sub-layer may be about 20 nm to 80 nm.

In an exemplary implementation, the thickness of the first refractive index layer may be greater than the thickness of the second refractive index layer. In some possible implementations, the thickness of the first sub-layer may be about 150 nm to 250 nm, the thickness of the second sub-layer may be about 30 nm to 90 nm, the thickness of the third sub-layer may be about 150 nm to 250 nm, the thickness of the fourth sub-layer may be about 30 nm to 90 nm, and the thickness of the fifth sub-layer may be about 150 nm to 250 nm.

In an exemplary implementation, in a visible light range, the first refractive index may be about 1.6 to 2.5, and the second refractive index may be about 1.3 to 1.5.

In an exemplary implementation, the material of the first refractive index layer may include any one or more of: an oxide and a nitride.

In an exemplary implementation, the oxide may include any one or more of: titanium dioxide, zirconium dioxide, and niobium pentoxide.

In an exemplary implementation, the nitride may include silicon nitride.

In an exemplary implementation, the material of the second refractive index layer may include any one or more of: silicon dioxide, magnesium fluoride, hafnium oxide, and aluminum oxide.

In an exemplary implementation, considering the use of silicon nitride and silicon dioxide during the preparation of the driving structure layer, the material of the first refractive index layer may be silicon nitride and the material of the second refractive index layer may be silicon dioxide. Since there is no need to introduce new devices and materials and the cost of silicon nitride and silicon dioxide is relatively low, the arrangement of the light modulation layer will not greatly increase the cost of the display substrate.

In an exemplary implementation, the plurality of sub-layers in the light modulation layer 50 may be sequentially deposited by plasma enhanced chemical vapor deposition (PECVD). The sequential deposition using the same deposition manner may simplify the process, eliminating the need to keep changing devices during the deposition which leads to process complexity. In some possible implementations, the plurality of sub-layers in the light modulation layer 50 may be sequentially evaporated or may be sequentially deposited by chemical vapor deposition (CVD).

(6) A capping layer is formed on the light modulation layer. In an exemplary implementation, forming the capping layer on the light modulation layer may include: attaching a capping layer 70 to the light modulation layer 50 using an optical adhesive layer 60, as shown in FIG. 6. In an exemplary implementation, the capping layer may be a Glass Cover or a thin film cover, which may be attached using an attaching process. For example, an optical adhesive layer 60 is first coated on the light modulation layer 50, and then a glass cover or a thin film cover is attached to the optical adhesive layer 60 by an attaching process. In an exemplary implementation, the thickness of the optical adhesive layer 60 may be about 40 μm to 60 μm, and the thickness of the capping layer 70 may be about 100 μm to 700 μm. In some possible implementations, the thickness of the optical adhesive layer 60 may be about 50 μm and the thickness of the capping layer 70 may be about 500 μm.

In an exemplary implementation, a protective layer may be formed first on the reflective layer and then a light modulation layer is formed on the protective layer. In an exemplary implementation, the protective layer may be a single-layer structure, and the material of the protective layer may be optically clear adhesive (OCA), which has the advantages of high cleanliness, high light transmittance, low haze, high adhesion, no crystal spots, no bubbles, water resistance, high temperature resistance, ultraviolet resistance, etc., and has uniform thickness and high flatness.

In an exemplary implementation, a touch function layer may be formed first on the reflective layer and then a light modulation layer is formed on the touch function layer. In an exemplary implementation, the touch function layer may be a multi-layer composite structure, the multi-layer composite structure may include a first protective layer, a touch structure layer (TSP), and a second protective layer, the touch structure layer may include a touch electrode layer, or include a touch electrode layer and a touch insulating layer, and the materials of the first protective layer and the second protective layer may be optically clear adhesive (OCA).

At this point, the preparation of the display substrate has been completed, as shown in FIG. 6. In an exemplary implementation, the display substrate prepared by the aforementioned preparation process may include:

a base 10;

a first insulating layer 11 arranged on the base 10;

a semiconductor layer arranged on the first insulating layer 11, the semiconductor layer at least including an active layer arranged in each sub-pixel;

a second insulating layer 12 overlying the semiconductor layer;

a first gate metal layer arranged on the second insulating layer 12, the first gate metal layer at least including a gate electrode and a first capacitor electrode arranged in each sub-pixel;

a third insulating layer 13 overlying the first gate metal layer;

a second gate metal layer arranged on the third insulating layer 13, the second gate metal layer at least including a gate electrode and a second capacitor electrode arranged in each sub-pixel, the position of the second capacitor electrode corresponding to the position of the first capacitor electrode;

a fourth insulating layer 14 overlying the second gate metal layer, the fourth insulating layer 14 in each sub-pixel being provided with two first via holes exposing the active layer;

a source-drain metal layer arranged on the fourth insulating layer 14, the source-drain metal layer at least including a source electrode and a drain electrode arranged in each sub-pixel, the source electrode and the drain electrode being respectively connected with the active layer through the first via hole such that a conductive channel is formed between the source electrode and the drain electrode;

a planarization layer 15 overlying the source-drain metal layer, the planarization layer 15 in each sub-pixel being provided with a second via hole exposing the drain electrode;

a transparent conductive layer arranged on the planarization layer 15, the transparent conductive layer at least including an anode 21 arranged in each sub-pixel, the anode 21 being connected with the drain electrode through the second via hole;

a pixel definition layer 22 arranged on the planarization layer 15, the pixel definition layer 22 in each sub-pixel being provided with a pixel opening exposing a surface of the anode 21;

an organic light emitting layer 23 arranged in the pixel opening of each sub-pixel, the organic light emitting layer 23 being connected with the anode 21;

a cathode 24 arranged on the organic light emitting layer 23, the cathode 24 being connected with the organic light emitting layer 23;

an encapsulation structure layer 25 overlying the cathode 24, the encapsulation structure layer 25 including a first encapsulation layer, a second encapsulation layer and a third encapsulation layer which are stacked, the first encapsulation layer and the third encapsulation layer being made of an inorganic material, and the second encapsulation layer being made of an organic material;

a reflective layer 30 arranged on the encapsulation structure layer 25, the reflective layer 30 in each sub-pixel being provided with a light transmission hole 31, the position of the light transmission hole 31 corresponding to the position of the pixel opening;

a light modulation layer 50 arranged on the reflective layer 30, the light modulation layer 50 being configured to reflect part of light rays in a blue light waveband and transmit light rays in wavebands other than the blue light waveband; and a capping layer 70 attached to the light modulation layer 50 through an optical adhesive layer 60.

At the time of preparing a flexible display substrate, the preparation process of the display substrate may further include stripping of the glass carrier plate 1, adhesion of a back film, cutting, and other processes, which is not limited in the present disclosure.

Figure 7:
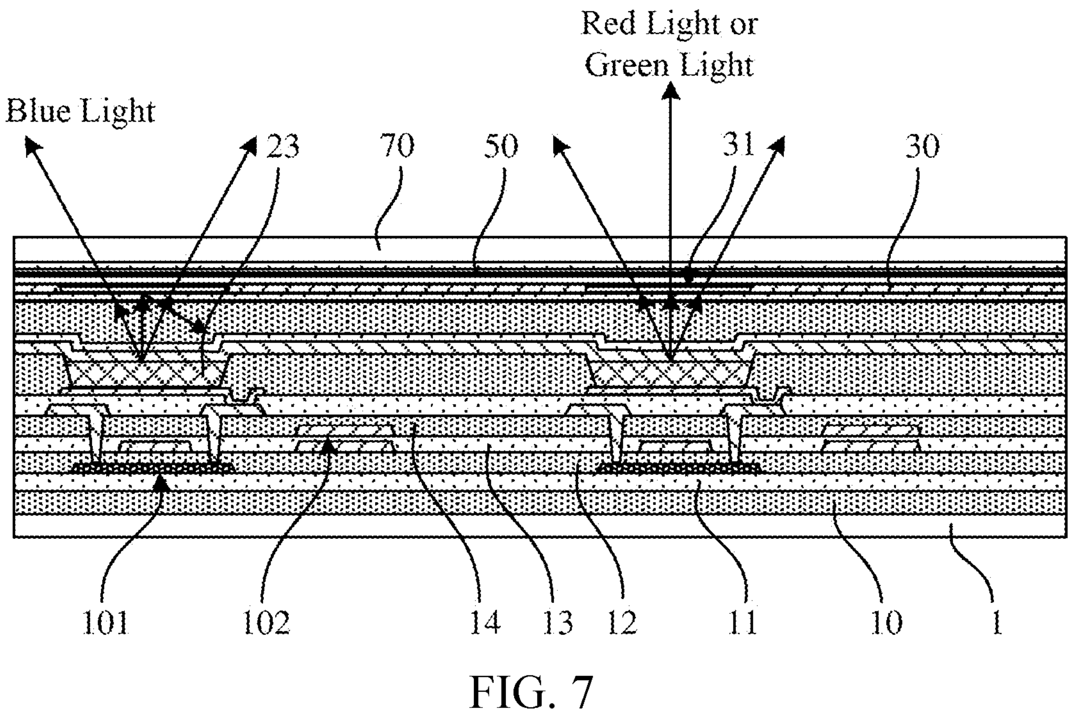
FIG. 7 is a schematic diagram of an anti-blue light function of a light modulation layer according to an exemplary embodiment of the present disclosure.

FIG. 7 is a schematic diagram of an anti-blue light function of a light modulation layer according to an exemplary embodiment of the present disclosure, in which the left-side sub-pixels are blue sub-pixels and the right-side sub-pixels are red sub-pixels or green sub-pixels. As shown in FIG. 7, the blue light emitted from the organic light emitting layer 23 of the blue sub-pixel is emitted from the light transmission hole 31 in the reflective layer 30. When the light passes through the light modulation layer 50, the light modulation layer 50 reflects a part of the light rays in the blue light waveband (430 nm to 480 nm) and transmits another part of the blue light, thereby reducing the quantity of blue light emitted from a side of the capping layer 70. The red light or green light emitted from the organic light emitting layer 23 of the red sub-pixel or the green sub-pixel is emitted from the light transmission hole 31 in the reflective layer 30. When the light passes through the light modulation layer 50, the light modulation layer 50 transmits all the light rays in the red light and green light waveband (500 nm to 760 nm), without reducing the quantity of red light emitted from a side of the capping layer 70 or the quantity of green light emitted from a side of the capping layer 70. In this way, not only the anti-blue light function is realized, but also the display brightness is guaranteed.

Figure 8:
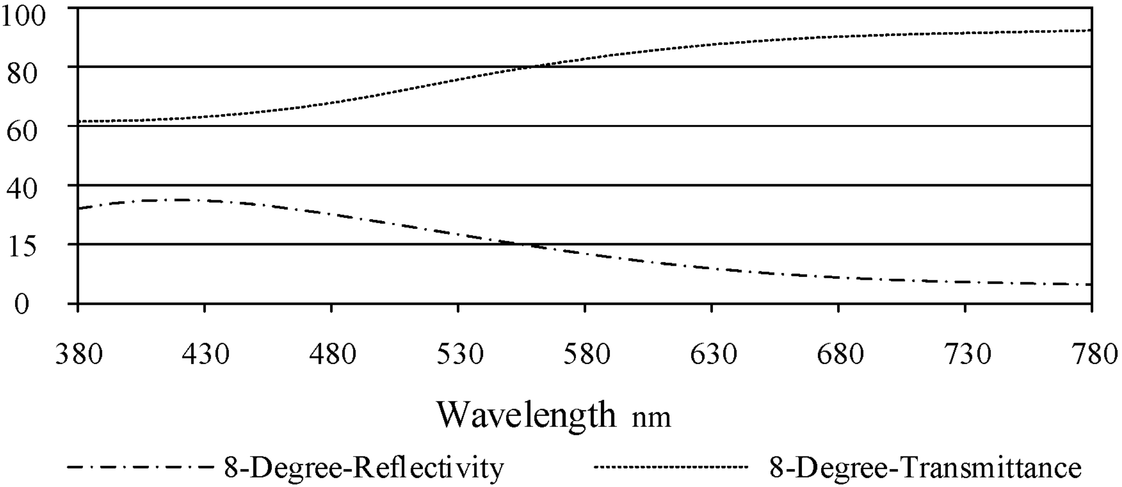
FIG. 8 and FIG. 9 are optical characteristic diagrams of a light modulation layer according to an exemplary embodiment of the present disclosure.

FIG. 8 is an optical characteristic diagram of a light modulation layer according to an exemplary embodiment of the present disclosure, illustrating simulation results of the light modulation layer including three sub-layers at an 8-degree viewing angle, with the abscissa being wavelength and the ordinate being reflectivity and transmittance. Table 1 shows corresponding reflectivity values and transmittance values. In an exemplary embodiment of the present disclosure, viewing angle refers to an angle between the line of sight of a human eye and the normal direction of the display substrate. As shown in FIG. 8 and Table 1, the three-sub-layer structured light modulation layer has a reflectivity of about 33% and a transmittance of about 66% for the blue light waveband (400 nm to 500 nm); has a reflectivity of about 21% and a transmittance of about 79% for the yellow and green light wavebands (500 nm to 600 nm); and has a reflectivity of about 19% and a transmittance of about 80% for all wavebands (400 nm to 760 nm).

TABLE 1

Reflectivity and transmittance of light modulation layer (three sub-layers, 8-degree viewing angle)

| | Reflectivity | Transmittance |
|---|---|---|
| Blue light (400 nm to 500 nm) | 33.07 | 65.52 |
| Yellow and green light (500 nm to 600 nm) | 20.93 | 79.05 |
| Entirety (400 nm to 760 nm) | 19.21 | 80.39 |

Figure 9:
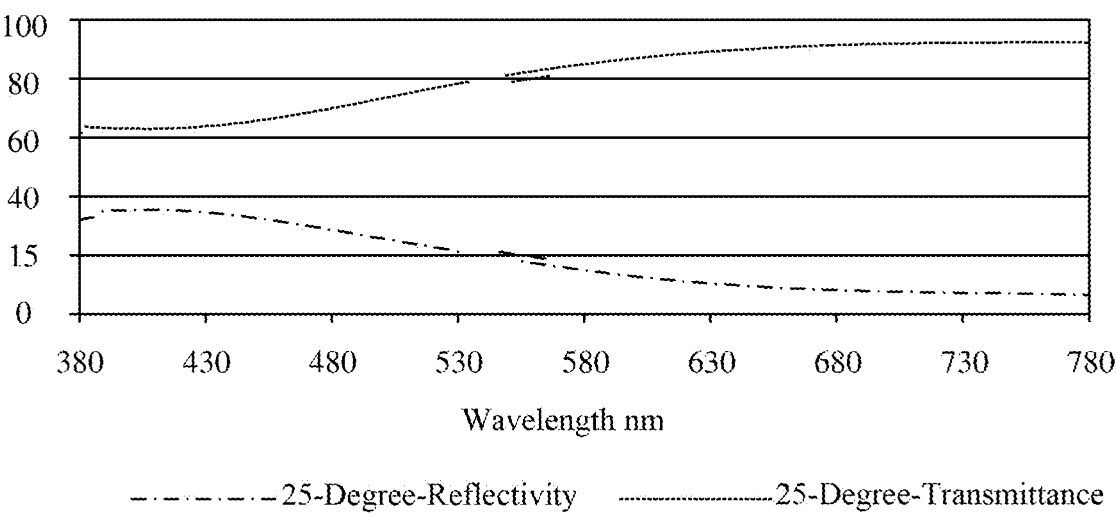

FIG. 9 is an optical characteristic diagram of a light modulation layer according to an exemplary embodiment of the present disclosure, illustrating simulation results of the light modulation layer including three sub-layers at a 25-degree viewing angle. Table 2 shows corresponding reflectivity values and transmittance values. As shown in FIG. 9 and Table 2, the three-sub-layer structured light modulation layer has a reflectivity of about 32% and a transmittance of about 66% for the blue light waveband (400 nm to 500 nm); has a reflectivity of about 19% and a transmittance of about 81% for the yellow and green light wavebands (500 nm to 600 nm); and has a reflectivity of about 18% and a transmittance of about 81% for all wavebands (400 nm to 760 nm). With the increase of the viewing angle, the reflectivity and transmittance change little, which ensures the viewing angle characteristics.

TABLE 2

Reflectivity and transmittance of light modulation layer (three sub-layers, 25-degree viewing angle)

| | Reflectivity | Transmittance |
|---|---|---|
| Blue light (400 nm to 500 nm) | 32.23 | 66.27 |
| Yellow and green light (500 nm to 600 nm) | 19.00 | 80.97 |
| Entirety (400 nm to 760 nm) | 18.11 | 81.46 |

Figure 10:
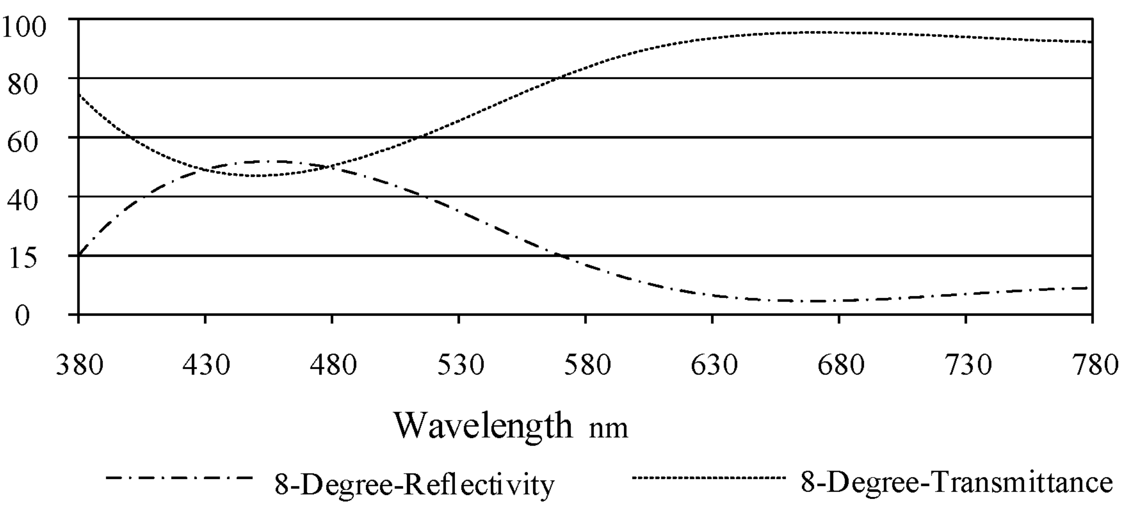
FIG. 10 and FIG. 11 are optical characteristic diagrams of another light modulation layer according to an exemplary embodiment of the present disclosure.

FIG. 10 is an optical characteristic diagram of another light modulation layer according to an exemplary embodiment of the present disclosure, illustrating simulation results of the light modulation layer including five sub-layers at an 8-degree viewing angle. Table 3 shows corresponding reflectivity values and transmittance values. As shown in FIG. 10 and Table 3, the five-sub-layer structured light modulation layer has a reflectivity of about 48% and a transmittance of about 50% for the blue light waveband (400 nm to 500 nm); has a reflectivity of about 27% and a transmittance of about 73% for the yellow and green light wavebands (500 nm to 600 nm); and has a reflectivity of about 24% and a transmittance of about 76% for all wavebands (400 nm to 760 nm). At the same viewing angle (8-degree viewing angle), the reflectivity of the five-sub-layer structured light modulation layer is greater than that of the three-sub-layer structured light modulation layer, and the transmittance of the five-sub-layer structured light modulation layer is smaller than that of the three-sub-layer structured light modulation layer.

TABLE 3

Reflectivity and transmittance of light modulation layer (five sub-layers, 8-degree viewing angle)

| | Reflectivity | Transmittance |
|---|---|---|
| Blue light (400 nm to 500 nm) | 48.02 | 50.23 |
| Yellow and green light (500 nm to 600 nm) | 27.45 | 72.50 |
| Entirety (400 nm to 760 nm) | 24.04 | 75.46 |

Figure 11:
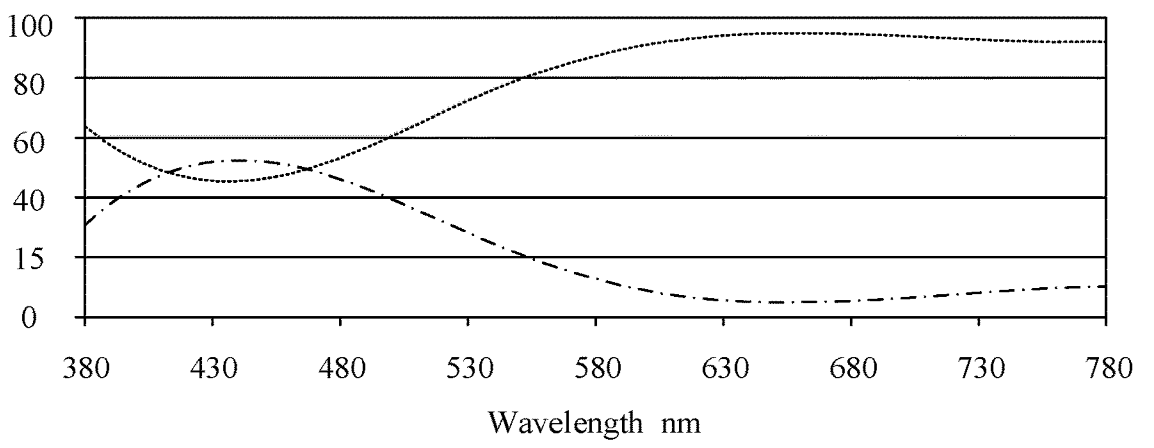

FIG. 11 is an optical characteristic diagram of another light modulation layer according to an exemplary embodiment of the present disclosure, illustrating simulation results of the light modulation layer including five sub-layers at a 25-degree viewing angle. Table 4 shows corresponding reflectivity values and transmittance values. As shown in FIG. 11 and Table 4, the five-sub-layer structured light modulation layer has a reflectivity of about 48% and a transmittance of about 50% for the blue light waveband (400 nm to 500 nm); has a reflectivity of about 22% and a transmittance of about 78% for the yellow and green light wavebands (500 nm to 600 nm); and has a reflectivity of about 23% and a transmittance of about 77% for all wavebands (400 nm to 760 nm). At the same viewing angle (25-degree viewing angle), the reflectivity of the five-sub-layer structured light modulation layer is greater than that of the three-sub-layer structured light modulation layer, and the transmittance of the five-sub-layer structured light modulation layer is smaller than that of the three-sub-layer structured light modulation layer. With the increase of the viewing angle, the reflectivity and transmittance change little, which ensures the viewing angle characteristics.

TABLE 4

Reflectivity and transmittance of light modulation layer (five sub-layers, 25-degree viewing angle)

| | Reflectivity | Transmittance |
|---|---|---|
| Blue light (400 nm to 500 nm) | 48.21 | 49.89 |
| Yellow and green light (500 nm to 600 nm) | 22.36 | 77.59 |
| Entirety (400 nm to 760 nm) | 22.73 | 76.72 |

As can be seen from the simulation results, in the blue light waveband, the reflectivity of the five-sub-layer structured light modulation layer is close to 50%, which can effectively achieve the blue light cut-off effect. In other wavebands, the transmittance of the five-sub-layer structured light modulation layer is 50% to 80%, which can effectively ensure relatively good transmittance in other wavebands.

For a display panel, although a solution of providing an anti-blue light thin film in an OLED display substrate is proposed, the solution has a large loss in brightness of light and has a poor anti-blue light effect. It is found through studies that for common OLED display, since external light will be reflected by a metal cathode, which will affect the contrast and display effect, a circular polarizer is required to avoid external light reflection. The arrangement of the circular polarizer having absorption and orientation for light not only causes relatively large brightness loss of light in display, but also changes the functionality of the anti-blue light thin film, resulting in a large brightness loss of light, poor anti-blue light effect, high power consumption and short service life. Simulation results show that for the solution of providing an anti-blue light thin film in common OLED display, the transmittance of the anti-blue light thin film is about 75% and the transmittance of the circular polarizer is about 45%, and therefore the overall transmittance is only 45%*75%=33.75%.

In an exemplary embodiment of the present disclosure, considering the influence of the circular polarizer on the anti-blue light effect and light brightness, a solution of combining the light modulation layer with a colored mirror OLED display substrate is proposed. The material of the reflective layer adopts a metal compound to form a colored mirror, and the reflectivity of the colored mirror is close to that of the circular polarizer, which has the characteristic of relatively low reflectivity, avoiding external light reflection. Therefore, the formed colored mirror display may not require a circular polarizer. In an exemplary embodiment of the present disclosure, by the good matching and reasonable application of the light modulation layer and the display substrate without a circular polarizer, when the transmittance of the light modulation layer is 75% to 80%, the overall transmittance is 75% to 80%, i.e., the display substrate as a whole has only 20% to 25% light loss which is caused by the light modulation layer, greatly reducing the light loss and also avoiding changing the anti-blue light function of the light modulation layer. Under the condition of the same brightness, the exemplary embodiment of the present disclosure can not only reduce power consumption but also improve the service life. Further, in the preparation of the display substrate in an exemplary embodiment of the present disclosure, the number of implementations of patterning is not increased and there is no need to add process devices, which leads to good process compatibility and strong practicability.

For the display substrate according to an exemplary embodiment of the present disclosure, by arranging the light modulation layer in the mirror display substrate, the anti-blue light function is realized, and the display brightness is also ensured, thus achieving the display effects of high transmission, wide viewing angle, flexibility, high definition, super blue light prevention and eye protection, etc.

The structure and its preparation process in the exemplary embodiments of the present disclosure are only exemplarily described. In an exemplary implementation, the corresponding structure may be changed and the patterning process may be added or reduced according to the actual needs. For example, the transistor in the driving structure layer may be a top gate structure or a bottom gate structure, or may be a single-gate structure or a double-gate structure. As another example, other film layer structures, electrode structures, or lead structures may further be provided in the driving structure layer and the light emitting structure layer. As a further example, the base may be a glass base. No specific limits are made in the present disclosure.

Figure 12:
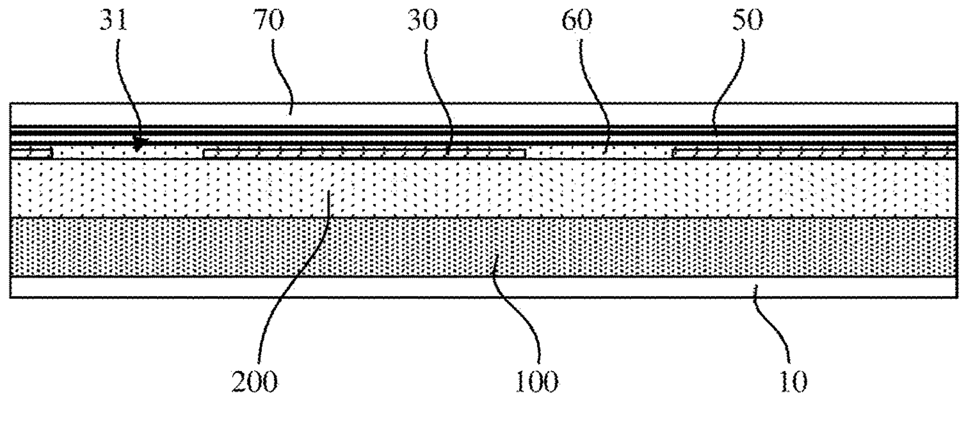
FIG. 12 is a schematic diagram of a structure of another display substrate according to an exemplary embodiment of the present disclosure.

FIG. 12 is a schematic diagram of a structure of another display substrate according to an exemplary embodiment of the present disclosure, illustrating a mirror OLED structure. As shown in FIG. 12, in an exemplary implementation, the display substrate includes a base 10, a driving structure layer 100 arranged on a surface of a side of the base 10 away from the base 10, a light emitting structure layer 200 arranged on a surface of a side of the driving structure layer 100 away from the base 10, a reflective layer 30 arranged on a surface of a side of the light emitting structure layer 200 away from the base 10, an optical adhesive layer 60 arranged on a surface of a side of the reflective layer 30 away from the base 10, a light modulation layer 50 arranged on a surface of a side of the optical adhesive layer 60 away from the base 10, and a capping layer 70 arranged on a surface of a side of the light modulation layer 50 away from the base 10. In an exemplary implementation, the light modulation layer 50 is arranged on a surface of a side of the capping layer 70 adjacent to the base 10, and the structures of the driving structure layer 100, the light emitting structure layer 200, the reflective layer 30, and the light modulation layer 50 may be similar to the corresponding structures described in the foregoing embodiments.

In an exemplary implementation, the preparation process of the display substrate may include two parts, there is no sequential requirement for the two parts and they can be performed simultaneously. One part is to sequentially prepare a base, a driving structure layer, a light emitting structure layer and a reflective layer on a glass carrier plate, and the preparation process may be similar to the preparation process described in the preceding embodiments. The other part is to provide a capping layer first, such as a glass cover or a thin film cover, and then sequentially deposit a plurality of sub-layers through a low-temperature deposition process to form a light modulation layer on the capping layer. After the completion of the two-part preparation, an optical adhesive layer is first coated on the reflective layer, and then a surface of a side of the capping layer formed with the light modulation layer is attached to the optical adhesive layer by an attaching process to complete the preparation of the display substrate.

Figure 13:
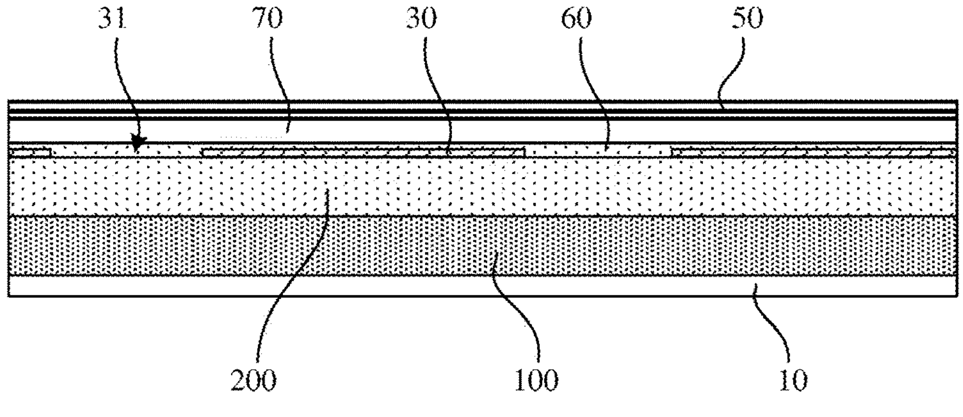
FIG. 13 is a schematic diagram of a structure of a further display substrate according to an exemplary embodiment of the present disclosure.

FIG. 13 is a schematic diagram of a structure of a further display substrate according to an exemplary embodiment of the present disclosure, illustrating a mirror OLED structure. As shown in FIG. 13, in an exemplary implementation, the display substrate includes a base 10, a driving structure layer 100 arranged on a surface of a side of the base 10 away from the base 10, a light emitting structure layer 200 arranged on a surface of a side of the driving structure layer 100 away from the base 10, a reflective layer 30 arranged on a surface of a side of the light emitting structure layer 200 away from the base 10, an optical adhesive layer 60 arranged on a surface of a side of the reflective layer 30 away from the base 10, a capping layer 70 arranged on a surface of a side of the optical adhesive layer 60 away from the base 10, and a light modulation layer 50 arranged on a surface of a side of the capping layer 70 away from the base 10. In an exemplary implementation, the light modulation layer 50 is arranged on a surface of a side of the capping layer 70 away from the base 10, and the structures of the driving structure layer 100, the light emitting structure layer 200, the reflective layer 30, and the light modulation layer 50 may be similar to the corresponding structures described in the foregoing embodiments.

In an exemplary implementation, the preparation process of the display substrate may include two parts, there is no sequential requirement for the two parts and they can be performed simultaneously. One part is to sequentially prepare a base, a driving structure layer, a light emitting structure layer and a reflective layer on a glass carrier plate, and the preparation process may be similar to the preparation process described in the preceding embodiments. The other part is to provide a capping layer first, such as a glass cover or a thin film cover, and then sequentially deposit a plurality of sub-layers through a low-temperature deposition process to form a light modulation layer on the capping layer. After the completion of the two-part preparation, an optical adhesive layer is first coated on the reflective layer, and then a surface of a side of the capping layer, on which no light modulation layer is formed, is attached to the optical adhesive layer by an attaching process to complete the preparation of the display substrate.

In an exemplary implementation, the preparation process of the display substrate may include: sequentially preparing a base, a driving structure layer, a light emitting structure layer and a reflective layer on a glass carrier plate, wherein the preparation process may be similar to the preparation process described in the preceding embodiments; then coating an optical adhesive layer on the reflective layer and attaching a capping layer to the optical adhesive layer by an attaching process, and finally sequentially depositing a plurality of sub-layers by a low-temperature deposition process, to form a light modulation layer on a surface of a side of the capping layer away from the base to complete the preparation of the display substrate.

In the present disclosure, the structure of the display substrate and the preparation process thereof are illustrated exemplarily by taking a mirror OLED as an example, which is not intended to limit the present disclosure. In an exemplary implementation, the light modulation layer of the present disclosure may be applied to other OLED structures. For example, for a top emission OLED structure, the reflective layer for realizing a mirror surface is not arranged on the light emitting structure layer, and the light modulation layer may be directly arranged on the light emitting structure layer. As another example, for a bottom emission OLED structure, the reflective layer for realizing a mirror surface is not arranged on the driving structure layer, and the light modulation layer may be directly arranged on a surface of a side of the base adjacent to the light emitting structure layer, or may be directly arranged on a surface of a side of the base away from the light emitting structure layer, which is not limited in the present disclosure. In an exemplary implementation, the light modulation layer of the present disclosure may be applied to an LCD display panel including an array substrate and a color filter substrate disposed oppositely. For example, the light modulation layer may be arranged on a side of the color filter substrate adjacent to the array substrate, or may be arranged on a side of the color filter substrate away from the array substrate. As another example, the light modulation layer may be arranged on a side of the array substrate adjacent to the color filter substrate, or may be arranged on a side of the array substrate away from the color filter substrate, which is not limited in the present disclosure.

The present disclosure further provides a preparation method for a display substrate. In an exemplary implementation, the preparation method for a display substrate may include:

S1, forming a light-emitting unit layer and a reflective layer arranged on the light-emitting unit layer sequentially on a base, the light-emitting unit layer including a plurality of light emitting units corresponding to different colors, and the reflective layer being provided with light transmission holes corresponding to the plurality of light-emitting units on a one-to-one basis; and S2, forming a light modulation layer, the light modulation layer being configured to reflect part of light rays in a blue light waveband and transmit light rays in wavebands other than the blue light waveband.

In an exemplary implementation, forming a light modulation layer may include:

forming a first sub-layer, a second sub-layer and a third sub-layer sequentially on the reflective layer; or forming a first sub-layer, a second sub-layer, a third sub-layer, a fourth sub-layer and a fifth sub-layer sequentially on the reflective layer; the first sub-layer, the third sub-layer and the fifth sub-layer being first refractive index layers having a first refractive index, and the second sub-layer and the fourth sub-layer being second refractive index layers having a second refractive index, the first refractive index being greater than the second refractive index.

In an exemplary implementation, forming a light modulation layer may include:

forming a first sub-layer, a second sub-layer and a third sub-layer sequentially on a capping layer; or forming a first sub-layer, a second sub-layer, a third sub-layer, a fourth sub-layer and a fifth sub-layer sequentially on a capping layer;

the first sub-layer, the third sub-layer and the fifth sub-layer being first refractive index layers having a first refractive index, the second sub-layer and the fourth sub-layer being second refractive index layers having a second refractive index, the first refractive index being greater than the second refractive index;

coating an optical adhesive layer on the reflective layer, and attaching the capping layer formed with a light modulation layer to the optical adhesive layer by an attaching process.

In an exemplary implementation, the light modulation layer is arranged on a surface of a side of the capping layer adjacent to the base, or the light modulation layer is arranged on a surface of a side of the capping layer away from the base.

In an exemplary implementation, the material of the reflective layer may include a metal-oxide composite structure or a metal-compound composite structure, which forms a colored mirror display, in the metal-oxide composite structure or the metal-compound composite structure, the metal includes any one or more of molybdenum, aluminum and titanium, the oxide includes any one or more of a molybdenum oxide, a copper oxide and a niobium oxide, and the compound includes a metal matrix composite material.

In an exemplary implementation, the thickness of the first sub-layer may be about 20 nm to 80 nm, the thickness of the second sub-layer may be about 80 nm to 120 nm, the thickness of the third sub-layer may be about 20 nm to 80 nm, the thickness of the fourth sub-layer may be about 80 nm to 120 nm, and the thickness of the fifth sub-layer may be about 20 nm to 80 nm.

In an exemplary implementation, the thickness of the first sub-layer may be about 150 nm to 250 nm, the thickness of the second sub-layer may be about 30 nm to 90 nm, the thickness of the third sub-layer may be about 150 nm to 250 nm, the thickness of the fourth sub-layer may be about 30 nm to 90 nm, and the thickness of the fifth sub-layer may be about 150 nm to 250 nm.

The specific preparation process of the display substrate has been described in detail in the previous embodiments, which will not be repeated here.

The present disclosure provides a preparation method for a display substrate, in which by the good matching and reasonable application of a light modulation layer and a display substrate without a circular polarizer, the light loss is greatly reduced, and the anti-blue light function of the light modulation layer is prevented from being changed. Under the condition of the same brightness, power consumption can be reduced, and the service life can also be improved. Further, for the preparation method for a display substrate, the number of implementations of patterning is not increased and there is no need to add process devices, which leads to good process compatibility, strong practicability and good application prospects.

The present disclosure further provides a display apparatus, including the aforementioned display substrate. The display apparatus may be any product or component with a display function, such as a mobile phone, a tablet computer, a television, a display, a notebook computer, a digital photo frame, and a navigator, or may be a wearable display apparatus, a car rearview mirror, a display screen of an Automatic Teller Machine (ATM), an advertising apparatus, a household appliance display apparatus, etc.

Although the implementations disclosed in the present disclosure are as above, the described contents are only implementations adopted for convenience of understanding the present disclosure and are not intended to limit the present disclosure. Any person skilled in the art to which the present disclosure pertains may make any modification and change to the implementation form and details without departing from the essence and scope of the present disclosure. However, the scope of patent protection of the present application should still be subject to the scope defined by the appended claims.

The invention claimed is:

1. A display substrate, comprising a light-emitting unit layer arranged on a base and a reflective layer arranged on the light-emitting unit layer, wherein the light-emitting unit layer comprises a plurality of light emitting units corresponding to different colors, and the reflective layer is provided with light transmission holes corresponding to the plurality of light-emitting units on a one-to-one basis; and a light modulation layer is arranged on a side of the reflective layer away from the base, and the light modulation layer is configured to reflect part of light rays in a blue light waveband and transmit light rays in wavebands other than the blue light waveband, wherein the display substrate further comprises an optical adhesive layer and a capping layer, the capping layer is arranged on a side of the reflective layer away from the base, the light modulation layer is arranged on a surface of a side of the capping layer away from the base, and the optical adhesive layer is arranged between the reflective layer and the capping layer, wherein a thickness of the optical adhesive layer is 50 μm and a thickness of the capping layer is 500 μm.

2. The display substrate according to claim 1, wherein the reflective layer comprises a metal-oxide composite structure or a metal-compound composite structure, which forms a colored mirror display.

3. The display substrate according to claim 2, wherein in the metal-oxide composite structure or the metal-compound composite structure, the metal comprises any one or more of molybdenum, aluminum and titanium, the oxide comprises any one or more of a molybdenum oxide, a copper oxide and a niobium oxide, and the compound comprises a metal matrix composite material.

4. The display substrate according to claim 3, wherein the light modulation layer comprises a plurality of sub-layers that are stacked, the plurality of sub-layers comprise a first refractive index layer having a first refractive index and a second refractive index layer having a second refractive index, and the first refractive index layer and the second refractive index layer in the plurality of sub-layers are alternately arranged, the first refractive index being greater than the second refractive index.

5. The display substrate according to claim 2, wherein the light modulation layer comprises a plurality of sub-layers that are stacked, the plurality of sub-layers comprise a first refractive index layer having a first refractive index and a second refractive index layer having a second refractive index, and the first refractive index layer and the second refractive index layer in the plurality of sub-layers are alternately arranged, the first refractive index being greater than the second refractive index.

6. The display substrate according to claim 1, wherein the light modulation layer comprises a plurality of sub-layers that are stacked, the plurality of sub-layers comprise a first refractive index layer having a first refractive index and a second refractive index layer having a second refractive index, and the first refractive index layer and the second refractive index layer in the plurality of sub-layers are alternately arranged, the first refractive index being greater than the second refractive index.

7. The display substrate according to claim 6, wherein the light modulation layer comprises a first sub-layer, a second sub-layer, and a third sub-layer that are stacked; or the light modulation layer comprises a first sub-layer, a second sub-layer, a third sub-layer, a fourth sub-layer and a fifth sub-layer that are stacked; and the first sub-layer, the third sub-layer and the fifth sub-layer are first refractive index layers having a first refractive index, and the second sub-layer and the fourth sub-layer are second refractive index layers having a second refractive index.

8. The display substrate according to claim 7, wherein the thickness of the first sub-layer is 20 nm to 80 nm, the thickness of the second sub-layer is 80 nm to 120 nm, the thickness of the third sub-layer is 20 nm to 80 nm, the thickness of the fourth sub-layer is 80 nm to 120 nm, and the thickness of the fifth sub-layer is 20 nm to 80 nm; or the thickness of the first sub-layer is 150 nm to 250 nm, the thickness of the second sub-layer is 30 nm to 90 nm, the thickness of the third sub-layer is 150 nm to 250 nm, the thickness of the fourth sub-layer is 30 nm to 90 nm, and the thickness of the fifth sub-layer is 150 nm to 250 nm.

9. The display substrate according to claim 6, wherein in a visible light range, the first refractive index is 1.6 to 2.5, and the second refractive index is 1.3 to 1.5.

10. A display apparatus, comprising the display substrate according to claim 1.

11. A preparation method for a display substrate, comprising:

forming a light-emitting unit layer and a reflective layer arranged on the light-emitting unit layer sequentially on a base, the light-emitting unit layer comprising a plurality of light emitting units corresponding to different colors, and the reflective layer being provided with light transmission holes corresponding to the plurality of light-emitting units on a one-to-one basis; and forming a light modulation layer, the light modulation layer being configured to reflect part of light rays in a blue light waveband and transmit light rays in other wavebands than the blue light waveband, coating an optical adhesive layer on the reflective layer, and attaching a capping layer formed with the light modulation layer to the optical adhesive layer by an attaching process, wherein the light modulation layer is arranged on a surface of a side of the capping layer away from the base, wherein a thickness of the optical adhesive layer is 50 μm and a thickness of the capping layer is 500 μm.

12. The method according to claim 11, wherein the forming a light modulation layer comprises:

forming a first sub-layer, a second sub-layer and a third sub-layer sequentially on a capping layer; or forming a first sub-layer, a second sub-layer, a third sub-layer, a fourth sub-layer and a fifth sub-layer sequentially on a capping layer;

the first sub-layer, the third sub-layer and the fifth sub-layer being first refractive index layers having a first refractive index, the second sub-layer and the fourth sub-layer being second refractive index layers having a second refractive index, the first refractive index being greater than the second refractive index.

13. The method according to claim 12, wherein the material of the reflective layer comprises a metal-oxide composite structure or a metal-compound composite structure, which forms a colored mirror display, in the metal-oxide composite structure or the metal-compound composite structure, the metal comprises any one or more of molybdenum, aluminum and titanium, the oxide comprises any one or more of a molybdenum oxide, a copper oxide and a niobium oxide, and the compound comprises a metal matrix composite material;

the thickness of the first sub-layer is 20 nm to 80 nm, the thickness of the second sub-layer is 80 nm to 120 nm, the thickness of the third sub-layer is 20 nm to 80 nm, the thickness of the fourth sub-layer is 80 nm to 120 nm, and the thickness of the fifth sub-layer is 20 nm to 80 nm; or the thickness of the first sub-layer is 150 nm to 250 nm, the thickness of the second sub-layer is 30 nm to 90 nm, the thickness of the third sub-layer is 150 nm to 250 nm, the thickness of the fourth sub-layer is 30 nm to 90 nm, and the thickness of the fifth sub-layer is 150 nm to 250 nm.

14. The method according to claim 11, wherein the material of the reflective layer comprises a metal-oxide composite structure or a metal-compound composite structure, which forms a colored mirror display, in the metal-oxide composite structure or the metal-compound composite structure, the metal comprises any one or more of molybdenum, aluminum and titanium, the oxide comprises any one or more of a molybdenum oxide, a copper oxide and a niobium oxide, and the compound comprises a metal matrix composite material;

the thickness of the first sub-layer is 20 nm to 80 nm, the thickness of the second sub-layer is 80 nm to 120 nm, the thickness of the third sub-layer is 20 nm to 80 nm, the thickness of the fourth sub-layer is 80 nm to 120 nm, and the thickness of the fifth sub-layer is 20 nm to 80 nm; or the thickness of the first sub-layer is 150 nm to 250 nm, the thickness of the second sub-layer is 30 nm to 90 nm, the thickness of the third sub-layer is 150 nm to 250 nm, the thickness of the fourth sub-layer is 30 nm to 90 nm, and the thickness of the fifth sub-layer is 150 nm to 250 nm.

* * * * *